(12) United States Patent
Tolentino et al.

(10) Patent No.: US 8,381,993 B2
(45) Date of Patent: Feb. 26, 2013

(54) METHOD FOR REALIZING A DUAL INTERFACE IC CARD

(75) Inventors: Franco Antonio Tolentino, Castellamare di Stabia (IT); Paolo Frallicciardi, Salerno (IT)

(73) Assignee: Incard S.A., Geneva (CH)

( * ) Notice: Subject to any disclaimer, the term of this patent is extended or adjusted under 35 U.S.C. 154(b) by 98 days.

(21) Appl. No.: 12/875,329

(22) Filed: Sep. 3, 2010

(65) Prior Publication Data
US 2011/0084145 A1 Apr. 14, 2011

(30) Foreign Application Priority Data
Sep. 4, 2009 (IT) .............................. MI2009A1536

(51) Int. Cl.
*G06K 19/06* (2006.01)
(52) U.S. Cl. ........................ 235/492; 235/451
(58) Field of Classification Search .................. 235/492, 235/451; 340/572.7, 572.8
See application file for complete search history.

(56) References Cited

U.S. PATENT DOCUMENTS

| 6,049,463 | A | * | 4/2000 | O'Malley et al. ............. 361/760 |
| 2006/0054709 | A1 | * | 3/2006 | Lee .................. 235/492 |
| 2007/0152072 | A1 | | 7/2007 | Frallicciardi et al. ......... 235/492 |
| 2007/0271467 | A1 | | 11/2007 | Ayala et al. .................... 713/185 |
| 2007/0272761 | A1 | * | 11/2007 | Ayala et al. .................... 235/492 |
| 2007/0279230 | A1 | | 12/2007 | Lakeman et al. ........... 340/572.7 |
| 2008/0283615 | A1 | | 11/2008 | Finn ............................... 325/488 |
| 2010/0181382 | A1 | * | 7/2010 | Speich .......................... 235/492 |
| 2011/0011939 | A1 | * | 1/2011 | Seah ............................. 235/492 |

FOREIGN PATENT DOCUMENTS

JP 2009080843 4/2009

* cited by examiner

*Primary Examiner* — Ahshik Kim
(74) *Attorney, Agent, or Firm* — Allen, Dyer, Doppelt, Milbrath & Gilchrist, P.A.

(57) ABSTRACT

A method for realizing a dual interface IC card includes arranging a plastic support having a hole or a recess for housing a micro module, and housing in the IC card an antenna having at least one first and one second terminal or pad for connection to the micro module arranged in the recess. The method also includes distributing a soldering paste on the at least one first and one second pad, so as to form a first and a second contact conductive bump with electric connection contacts of the micro module, and distributing, along the whole perimeter of the micro module or of the recess, a layer of non conductive glue. The method further includes positioning the micro module in the recess with the contacts axially aligned to the terminal of the antenna, and executing a reflow of the soldering paste to form the first and second conductive bump.

19 Claims, 7 Drawing Sheets

METHOD FOR REALIZING A DUAL INTERFACE IC CARD

FIELD OF THE INVENTION

The present invention relates to a method for realizing an IC card of the Dual Interface type. The present invention also relates to an IC card of the Dual Interface type.

The invention particularly, but not exclusively, relates to a method for realizing an IC card of the Dual Interface type, of the type comprising an antenna included in the body of the card, and the following description is made with reference to this field of application by way of illustration only.

BACKGROUND OF THE INVENTION

An IC card is made of a plastic support with a hole or recess wherein a microchip micro module is mounted and coupled to a connection interface that can be a contacting instrument, printed circuit micro module IC, or an antenna. The microchip provides calculation functionality and data storage while the micro module of the antenna allows the microchip to dialogue with a special reading terminal usually connected to a computer by a serial interface, parallel interface, USB interface, or gate, etc. The IC cards can be of the contact or contactless type according to the type of connection interface existing between the microchip and the external world. The first have a microchip micro module through which they receive the power supply and dialogue with the outside if inserted in a suitable terminal device, called IC card reader. The second also have an antenna that is connected to the micro module and reacts an electromagnetic field being present and emitted by a special reading/writing device in the band of the radio-frequencies, allowing the microchip to exchange data with the outside, provided that the antenna is at a minimum distance from the reading/writing device. Both the dual-interface IC card offer the contact and contactless interfaces and, therefore, the communication with the microchip can occur indifferently by means of either the one or the other. This feature allows to integrate on the same IC card both complex applications such as those of digital form typical of the contact IC cards, and simpler and faster ones, such as those of control of the access to reserved areas, which exclusively require wireless memory accesses.

An approach is described in the US patent application 2007/0152072 filed by the same Applicant. By way of example, the annexed FIG. 1 shows an exploded view of a generic IC card 10, comprising a plastic support 1 with a hole or recess 6, a micro module 2 and a microchip 3 incorporated in the micro module 2. In particular, the micro module 2 comprising the microchip 3 and glued in the hole or recess 6 through an epoxy resin 9 used as glue. More specifically, as shown in the annexed FIGS. 2a and 2b, the micro module 2 comprises a plurality of conductive areas a1, ... an, glued through epoxy resin glues 9 and the microchip 3 which is part of the micro module is electrically connected through bonding wires to the conductive areas of the same micro module 2. Everything is sealed in the hole 6. Some of these conductive areas a1 ... ak are connected through a corresponding plurality of bonding wires w1 ... wj to the microchip 3 in a plurality of contact points c1 ... ck.

These contact points c1 ... ck supply the communication path between an external reading writing device 4 and the microchip 3. In particular, the communication between an external wireless writing/reading device 8 and the IC card 10 occurs without contact when the IC card is provided with an antenna 5 positioned inside the plastic support 1 and connected to the contact points c1 ... ck through a pair of pads p1, p2, as schematically shown in the annexed FIG. 3. The antenna sends and receives electromagnetic waves to and from a coupled antenna 7 included in the external wireless writing/reading device 8. In this case, the microchip 3 is supplied through electromagnetic induction by the external device 8.

The IC card takes its intelligence from the integrated microchip through silicon technology. In particular, with reference to FIG. 3, at present the contacts between the pads of the micro module 2 and the pads of the antenna 5 are realized by using the "Anisotropic Conductive Film" (ACF) technology or, alternatively, the "Conductive Resin" technology. Both include realizing the contacts with a resinous matrix in which conductive silver particles are mixed which realize the conduction through contact. The annexed FIG. 4 shows the section of an IC card 40 comprising an antenna 45 comprising a pad p41 and a pad p42 which contact the pads c41 and c42 of the micro module 42 through a first and a second bump 46 and 47 of conductive resin or of conductive anisotropic film. In this type of IC card, however, remarkable problems of the conduction are caused by thermal, mechanical, chemical stresses linked exactly to the use of conductive films or resins.

Despite these advances in the prior art, it would still be desirable to devise a method for realizing a double interface or dual interface IC card, having such structural and functional characteristics so as to realize a good conduction overcoming the limits and/or drawbacks of the dual interface IC cards of the prior art.

SUMMARY OF THE INVENTION

The approach of the present invention is that of realizing a method for realizing a dual interface IC card wherein the micro module incorporating the microchip is housed in the respective seat and soldered to the terminals of the antenna by means of a soldering paste by using an eutectic alloy, for example of bismuth-tin, and executing the conduction through melting of the alloy. The melting temperature is reached through electromagnetic induction by using a solenoid.

In substance the terminals of the antenna are positioned in the housing seat of the micro module below, and in correspondence with, the conductive contacts of the micro module and covered by a soldering paste alloy. The melting of the alloy establishes stable electric contact between the terminals of the antenna and the electric contacts of the micro module and makes the antenna integral with the micro module.

A method according to the present invention includes arranging a plastic support comprising a hole or a recess, for housing a micro module, and housing in the IC card an antenna having at least one first and one second terminal or pad of connection to the micro module arranged in the recess. The method also includes distributing a soldering paste on the at least one first and one second pad, so as to form a first and a second contact conductive bump with electric connection contacts of the micro module. The method also includes distributing, along the whole perimeter of the micro module or of the recess, a layer of non conductive glue, and positioning the micro module in the recess with the contacts axially aligned to the terminals of the antenna. A reflow of the soldering paste is executed to form said first and second conductive bump.

Advantageously, the step of distributing a soldering paste on the at least one first and one second pad comprises the distribution of a conductive eutectic alloy of bismuth and tin.

Moreover, the reflow step of the soldering paste provides the attainment of the melting temperature of the alloy through electromagnetic induction.

Another aspect is directed to an IC card comprising a plastic support comprising a hole or recess, for housing a microchip micro module, and an antenna having at least one first and one second terminal or pad of connection to the micro module. A micro module comprises at least one first and one second contact of connection to the antenna. At least one first and one second conductive bump positioned on the at least one first and one second terminal and in contact with the at least one first and one second contact, the at least one first and one second conductive bump being obtained starting from a conductive soldering paste.

The characteristics and the advantages of the method and of the IC card device according to the invention will be apparent from the following description of an embodiment given thereof by way of indicative and non limiting example with reference to the annexed drawings.

DETAILED DESCRIPTION OF THE PREFERRED EMBODIMENTS

With reference to these figures, the method for realizing an IC card of the Dual Interface type according to the invention is described.

To the purposes of the invention it is helpful to note that the operative steps leading to the realization of a microchip micro module 52 are distinct from what is described hereafter and relate to the realization of a film or support tape for micro modules wherein a plurality of micro modules, each incorporating a microchip, are orderly arranged on the tape and covered by a protective resin. The invention instead relates to the modes of connection between a micro module 52 and the antenna 55 incorporated in the card.

Figure 1:
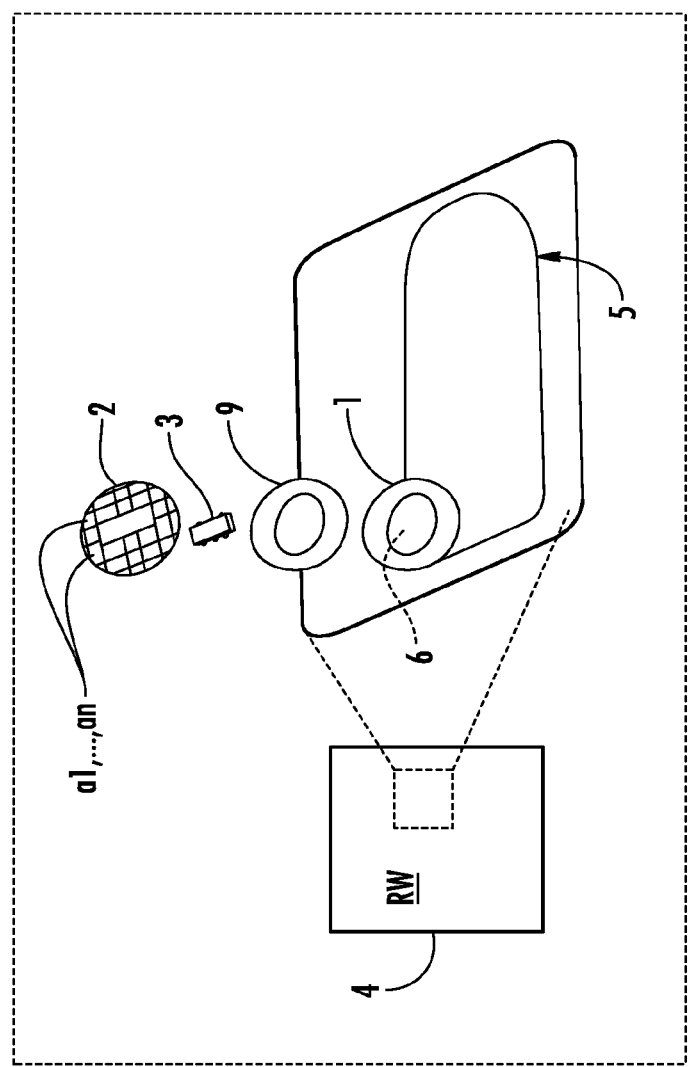
FIG. 1 shows an exploded schematic view of an IC card comprising a micro module, according to the prior art.
Figure 2A:
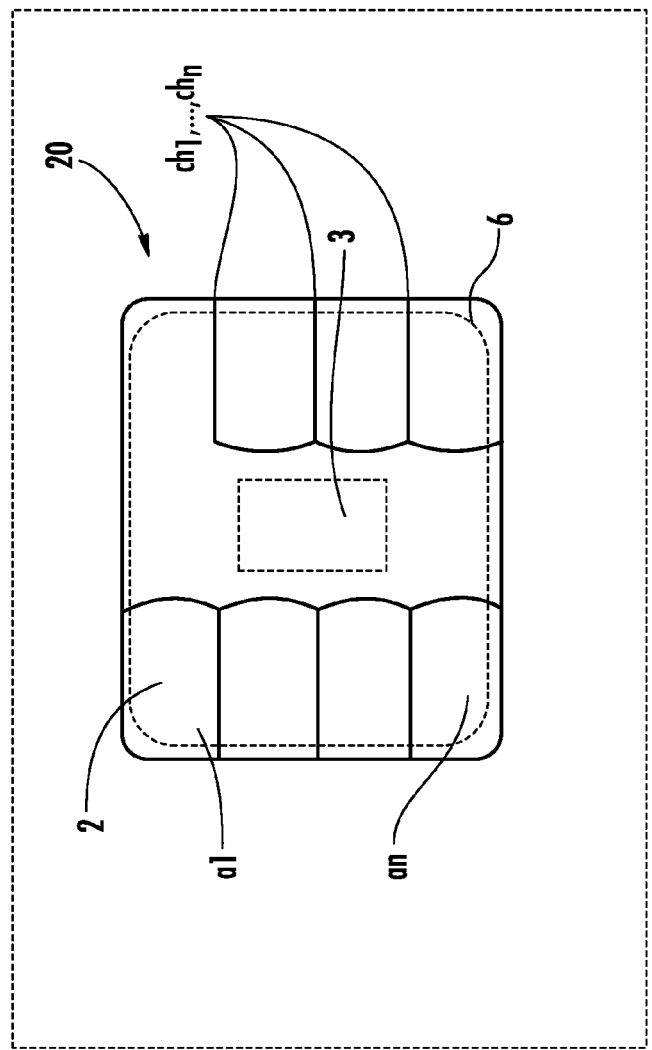
FIG. 2a shows a view from above of the micro module of FIG. 1, according to the prior art.
Figure 2B:
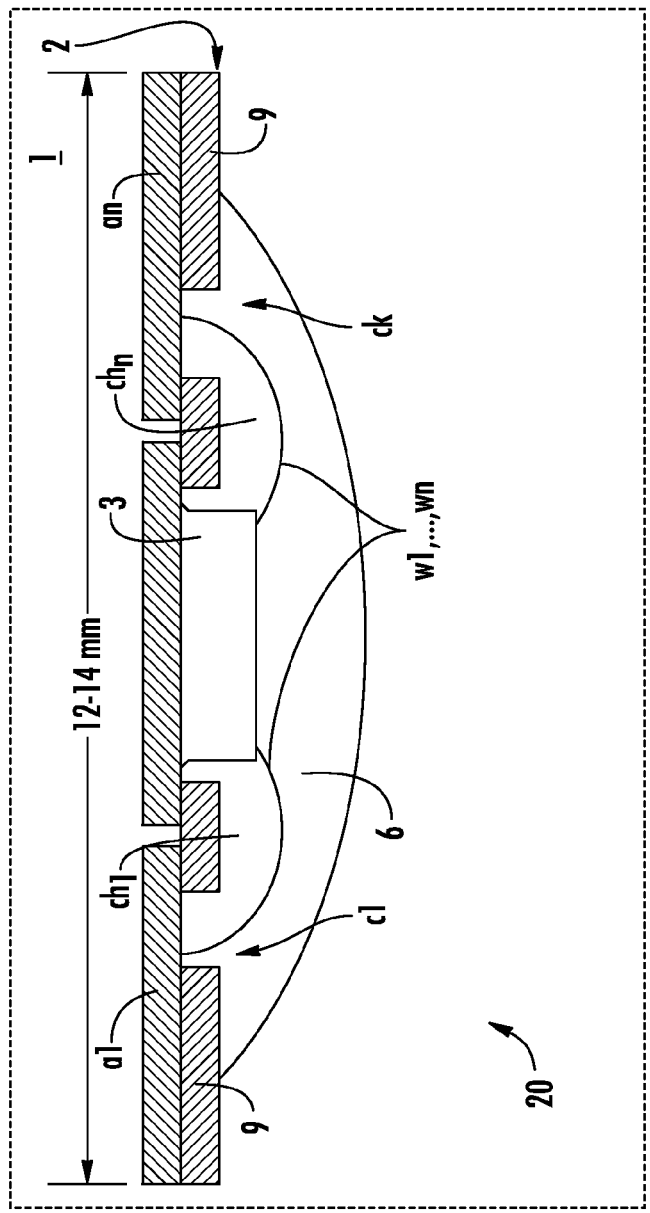
FIG. 2b shows a section view of FIG. 2a, according to the prior art.
Figure 3:
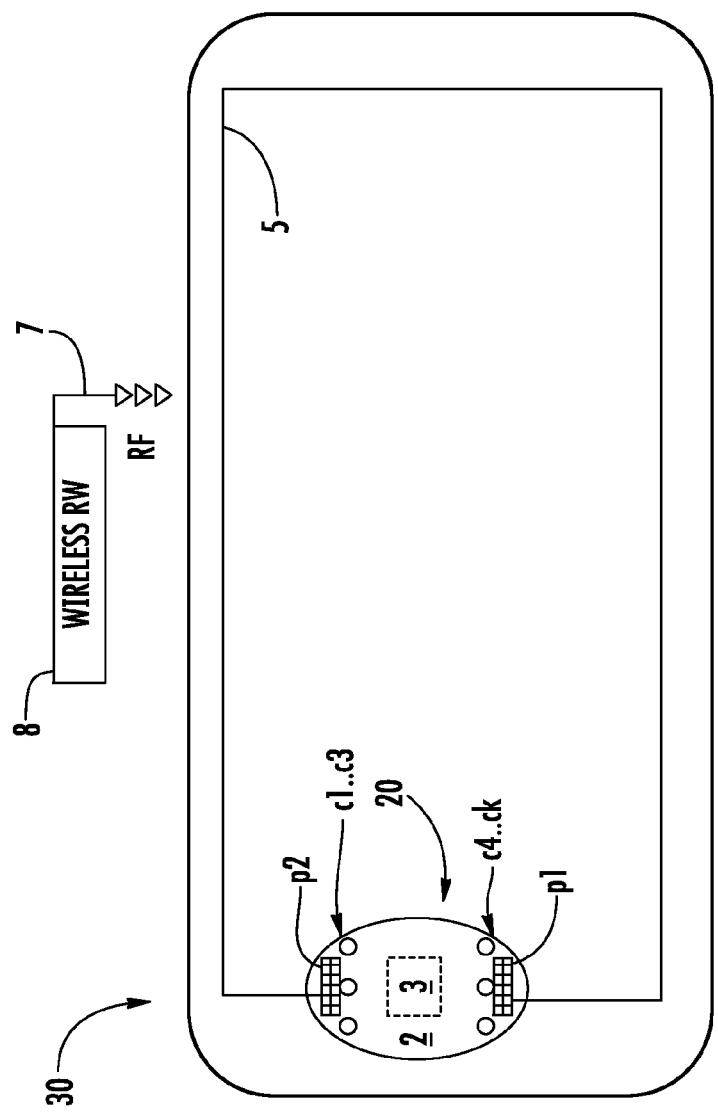
FIG. 3 shows the connection between the micro module to an antenna, according to the prior art.
Figure 4:
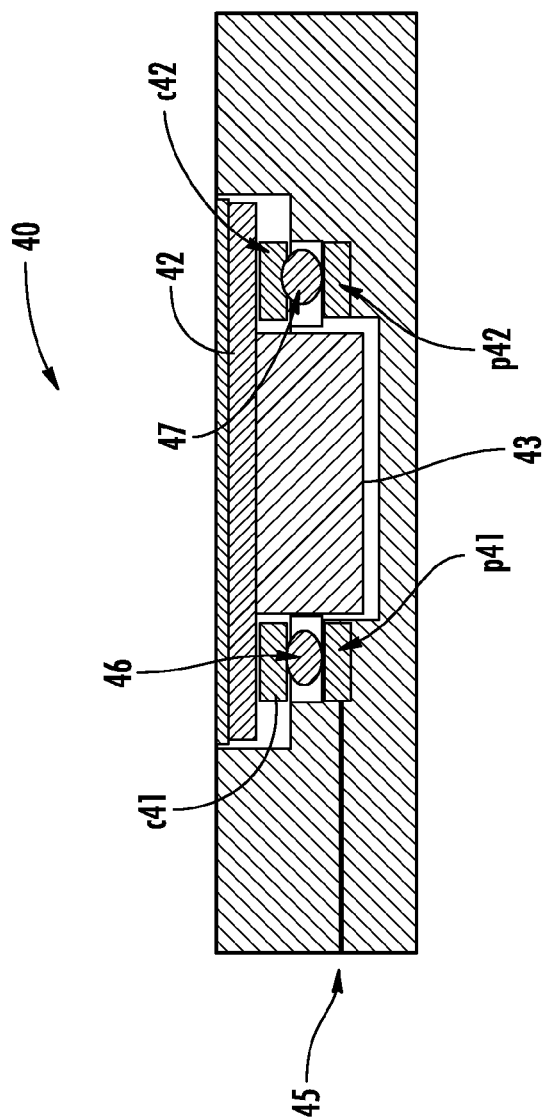
FIG. 4 shows a section view of a dual interface IC card comprising a micro module, according to the prior art.
Figure 5:
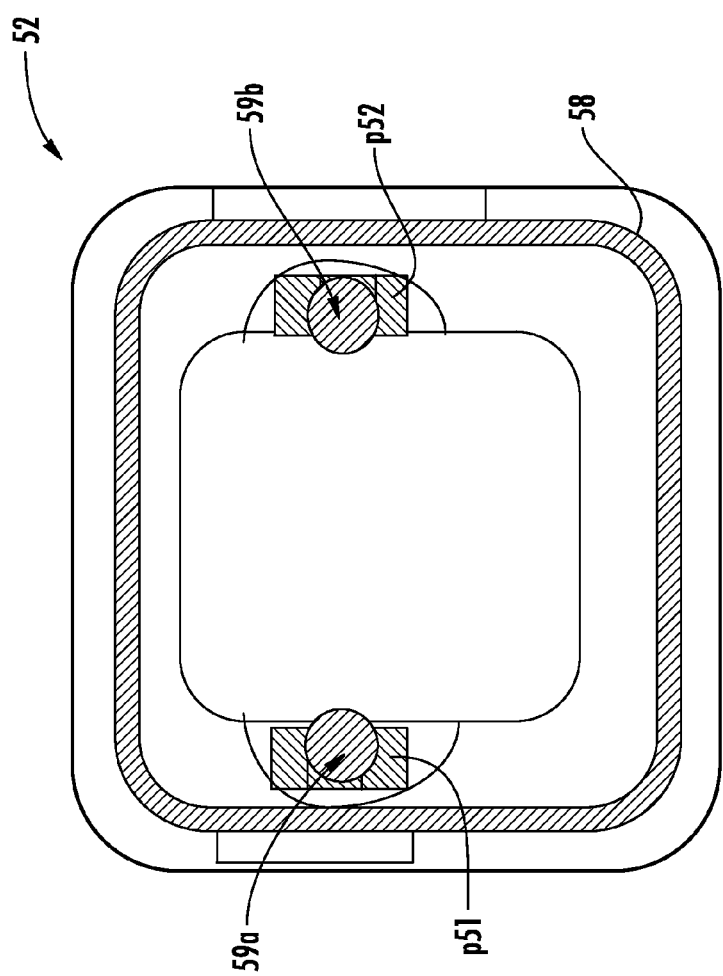
FIG. 5 shows a view from above of a micro module, according to the invention.
Figure 6:
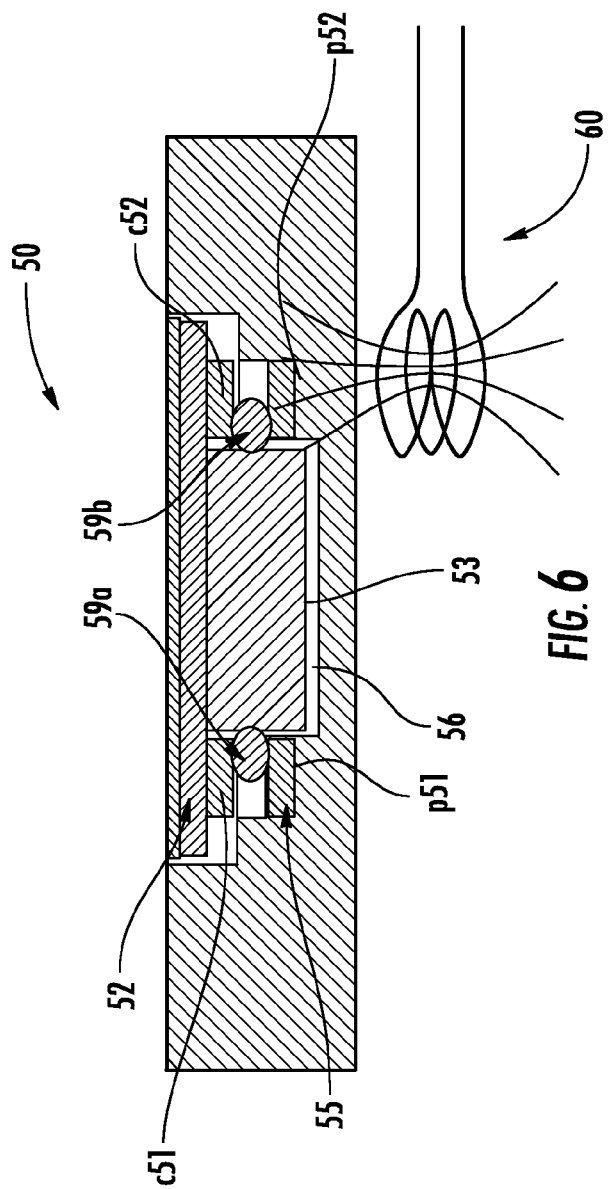
FIG. 6 shows a section view of a dual interface IC card comprising the micro module of FIG. 5, according to the invention.

In particular, as shown in FIG. 5, in addition to the realization steps of an IC card the method according to the invention first provides the step of housing an antenna 55 in the card with the connection terminals or pads p51 and p52 housed in the recess 56 or housing hole of the micro module. Subsequently, the distribution is provided of an electrically conductive soldering paste on the pads p51 and p52 of the antenna 55 comprised in the IC card of the Dual Interface 50 type, as shown in FIG. 6.

The micro module 52 has contacts c51 and c52 arranged in the surface opposed to the exposed surface and intended for being axially overlapped onto the terminals p51 and p52 of the antenna 55 when the micro module is housed in the recess 56.

In correspondence with the pads p51, p52, the soldering paste will result to be in contact with contacts c51 and c52 of the micro module 52 so as to form two conductive bumps 59a and 59b. Prior to the housing of the micro module 52 in the recess 56 a continuous and annular layer 58 of electrically non conductive liquid glue is distributed outside the pads p51, p52 of the antenna and along the perimeter of the micro module 52 or along the perimeter of the housing recess 56 of the micro module.

When the micro module 52 is inserted and housed in the recess 56 the contacts c51 and c52 are arranged in axial alignment with the terminals p51 and p52 of the antenna 55 with interposition, between them, of the soldering paste, not solidified yet.

A "reflow" step of the soldering paste is then executed. With the method, between the pads p51 and p52 of the antenna 55 and the contacts c51 and c52 of the micro module 52, a soldering is formed that ensures high electric conductivity and mechanical resistance. More in particular, the soldering paste comprises a conductive eutectic alloy of bismuth and tin, respectively in percentage of 58% and of 42%, that has a melting temperature lower than both the melting temperatures of the two metals and that, after the cooling and the subsequent consolidation, shows an excellent mechanical resistance.

During the soldering step the consolidation also occurs of the non conductive glue arranged peripherally with respect to the micro module 52 or the recess 56. Advantageously, the melting temperature for the soldering of the soldering paste is reached through electromagnetic induction by a solenoid 60 to avoid that the melting temperature of the bismuth-tin alloy, which, although low, is however higher than those of the conductive resins, can damage the plastic support 51 of the IC card 50.

More in detail, the soldering paste is applied on the pads of the antenna printing it through a stencil, or by screening and dispensing methods. Usually, the paste is distributed by "pin transfer" (i.e. a grid of pins are immerged in the soldering paste and then applied to the board) or through "jet printing", in which the paste is distributed on the pads as from an inkjet printer. The printing step is followed by pre-heating and reflow (melting).

FIG. 6 shows a section view of the dual interface IC card 50 comprising the micro module 52. The IC card 50 comprises a plastic support 51 with a hole or recess 56, an integrated microchip 53 incorporated in the micro module 52. The IC card 50 also comprises the antenna 55 comprising the pad p51 and the pad p52 that are in electric connection with the contacts c51 and c52 of the micro module 52 through the two conductive bumps 59a and 59b of soldering alloy.

In conclusion, the method allows, then, to obtain, inside an IC card, a good physical connection between the antenna and the soldering paste. An advantage is that the soldering allows to obtain a good electric conduction, that does not degrade due to thermal, mechanical and chemical stresses. Moreover, it is possible, thanks to the method, to obtain a greater mechanical affinity and a greater resistance to the oxidation and humidity.

Finally, thanks to the fact that the soldering is obtained through induction and not through conduction, a selective soldering is obtained that does not involve and does not jeopardize the plastic support of the IC card.

That which is claimed is:

1. A method of making a dual interface IC card comprising:
    forming a plastic support having a recess defined therein for receiving a micro-module;
    placing solder paste on first and second conductive pads of the micro-module so as to form first and second solder paste bumps thereon;
    placing non-conductive glue along a perimeter of the recess;
    positioning the micro-module in the recess with the first and second conductive pads aligned with first and second terminals of an antenna; and
    reflowing the first and second solder paste bumps to form first and second conductive bumps coupling the first and second conductive pads of the micro-module to the first and second terminals of the antenna.

2. A method according to claim 1, wherein the solder paste comprises a conductive eutectic alloy of bismuth and tin.

3. A method according to claim 2, wherein the conductive eutectic alloy comprises, by weight percentage, 58% bismuth and 42% tin.

4. A method according to claim 1, wherein reflowing the first and second solder paste bumps comprises heating the first and second solder paste bumps to a melting point thereof using electromagnetic induction.

5. A method according to claim 4, wherein the electromagnetic induction is realized by a solenoid positioned adjacent the dual interface IC card.

6. A method according to claim 1, wherein the solder paste is placed on the first and second conductive pads by one of printing using a stencil, screening and dispensing, pin transfer, or jet printing.

7. A method of making a dual interface IC card comprising:
    forming a plastic support having a recess defined therein for receiving a micro-module;
    placing solder paste on first and second conductive pads of the micro-module so as to form first and second solder paste bumps thereon;
    placing non-conductive glue along a perimeter of the micro-module;
    positioning the micro-module in the recess with the first and second conductive pads aligned with first and second terminals of an antenna; and
    reflowing the first and second solder paste bumps to form first and second conductive bumps coupling the first and second conductive pads of the micro-module to the first and second terminals of the antenna.

8. A method according to claim 7, wherein the solder paste comprises a conductive eutectic alloy of bismuth and tin.

9. A method according to claim 8, wherein the conductive eutectic alloy comprises, by weight percentage, 58% bismuth and 42% tin.

10. A method according to claim 7, wherein reflowing the first and second solder paste bumps comprises heating the first and second solder paste bumps to a melting point thereof using electromagnetic induction.

11. A method according to claim 10, wherein the electromagnetic induction is realized by a solenoid positioned adjacent the dual interface IC card.

12. A method according to claim 7, wherein the solder paste is placed on the first and second conductive pads by one of printing using a stencil, screening and dispensing, pin transfer, or jet printing.

13. A method of making a dual interface IC card comprising:
    forming a support having a recess defined therein for receiving a micro-module;
    placing solder on first and second conductive pads of the micro-module so as to form first and second solder bumps thereon;
    positioning the micro-module in the recess and attaching the micro-module to a perimeter of the recess, with the first and second conductive pads aligned with first and second terminals of an antenna; and
    reflowing the first and second solder bumps to form first and second conductive bumps coupling the first and second conductive pads of the micro-module to the first and second terminals of the antenna.

14. A method according to claim 13, wherein the solder comprises a conductive eutectic alloy of bismuth and tin.

15. A method according to claim 14, wherein the conductive eutectic alloy comprises, by weight percentage, 58% bismuth and 42% tin.

16. A method according to claim claim 13, wherein reflowing the first and second solder bumps comprises heating the first and second solder bumps to a melting point thereof using electromagnetic induction.

17. A dual interface IC card comprising:
    a plastic support having a recess defined therein;
    a micro-module positioned in the recess and attached to a perimeter of the recess, and having first and second conductive pads;
    an antenna having first and second terminals; and
    first and second conductive bumps coupling the first and second conductive pads to the first and second terminals.

18. A dual interface IC card according to claim 17, wherein the first and second conductive bumps comprise a conductive eutectic alloy of bismuth and tin.

19. A dual interface IC card according to claim 18, wherein the micro-module is attached to the perimeter of the recess by a non-conductive glue.

* * * * *